US008233277B2

(12) United States Patent
Yang

(10) Patent No.: US 8,233,277 B2
(45) Date of Patent: Jul. 31, 2012

(54) HEAT DISSIPATION DEVICE WITH SELF-LOCKING BASE

(75) Inventor: Jian Yang, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, New Taipei (TW)

( * ) Notice: Subject to any disclaimer, the term of this patent is extended or adjusted under 35 U.S.C. 154(b) by 126 days.

(21) Appl. No.: 12/792,736

(22) Filed: Jun. 3, 2010

(65) Prior Publication Data

US 2011/0261532 A1     Oct. 27, 2011

(30) Foreign Application Priority Data

Apr. 27, 2010   (CN) .......................... 2010 1 0157237

(51) Int. Cl.
*H05K 7/20* (2006.01)
(52) U.S. Cl. ........ 361/695; 361/699; 361/700; 361/719; 165/80.3; 165/80.4; 165/104.26; 174/15.2
(58) Field of Classification Search .................... None
See application file for complete search history.

(56) References Cited

U.S. PATENT DOCUMENTS

| 5,452,181 | A  | * | 9/1995 | Hoover ......................... 361/697 |
| 6,519,150 | B1 | * | 2/2003 | Chen et al. ..................... 361/697 |
| 6,913,070 | B2 | * | 7/2005 | Wang et al. .................... 165/80.3 |
| 6,952,348 | B2 | * | 10/2005 | Wu .................................. 361/719 |
| 7,164,582 | B2 | * | 1/2007 | Hegde ............................ 361/697 |
| 7,606,031 | B2 | * | 10/2009 | Hsieh et al. ..................... 361/700 |
| 7,665,509 | B2 | * | 2/2010 | Tung et al. ............... 165/104.26 |
| 8,050,038 | B2 | * | 11/2011 | Chen et al. ..................... 361/719 |
| 8,059,410 | B2 | * | 11/2011 | Chen et al. ..................... 361/719 |
| 2007/0121291 | A1 | * | 5/2007 | Wang et al. .................... 361/695 |

* cited by examiner

*Primary Examiner* — Boris Chervinsky
(74) *Attorney, Agent, or Firm* — Altis Law Group, Inc.

(57) ABSTRACT

A heat dissipation device for dissipation of heat from an electronic component includes a base for contacting the electronic component, a shroud connected to the base and multiple fins arranged on the bottom section of the shroud. The shroud comprises a bottom section defining an opening therein and a plate within the opening and connected to the bottom section by multiple beams. Multiple fins in the form of a fin assembly are mounted on the bottom section. The base includes a plate and multiple latch hooks extending upwardly from the plate. The latch hooks are extended into the bottom section to lock with the bottom section, thereby securing the base onto the shroud.

17 Claims, 5 Drawing Sheets

HEAT DISSIPATION DEVICE WITH SELF-LOCKING BASE

BACKGROUND

1. Technical Field

The present disclosure relates to a heat dissipation device and, more particularly, to a heat dissipation device having a self-locking base which could be conveniently assembled.

2. Description of Related Art

Nowadays electronic components have higher working frequency that are promoted from the development in the related semiconductor technologies. The higher working frequency thereby raises the processing ability of the electronic components; however, it also renders the electronic component to produce much more heat than previously did. Thus, it is required to dissipate the heat from the electronic components in a timely manner for maintaining normal operations thereof.

A conventional heat dissipation device includes a base for contacting the electronic component, a bottom section connected to the base and a plurality of fins arranged on the bottom section for the dissipation of heat to the ambient environment. In order to enhance the heating dissipating strength of the heat dissipation device, the base is often fixed to the bottom section by soldering. However, it is inconvenient to solder the base to the bottom section since a clamp is required to position the base on the bottom section during the soldering of the base and the bottom section together. Using the clamp requires additional labor and thus is a time-waste in the manufacturing of the heat dissipation device.

What is needed, therefore, is a heat dissipation device which can overcome the limitations described above.

BRIEF DESCRIPTION OF THE DRAWINGS

Many aspects of the present disclosure can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION OF THE EMBODIMENTS

Figure 1:
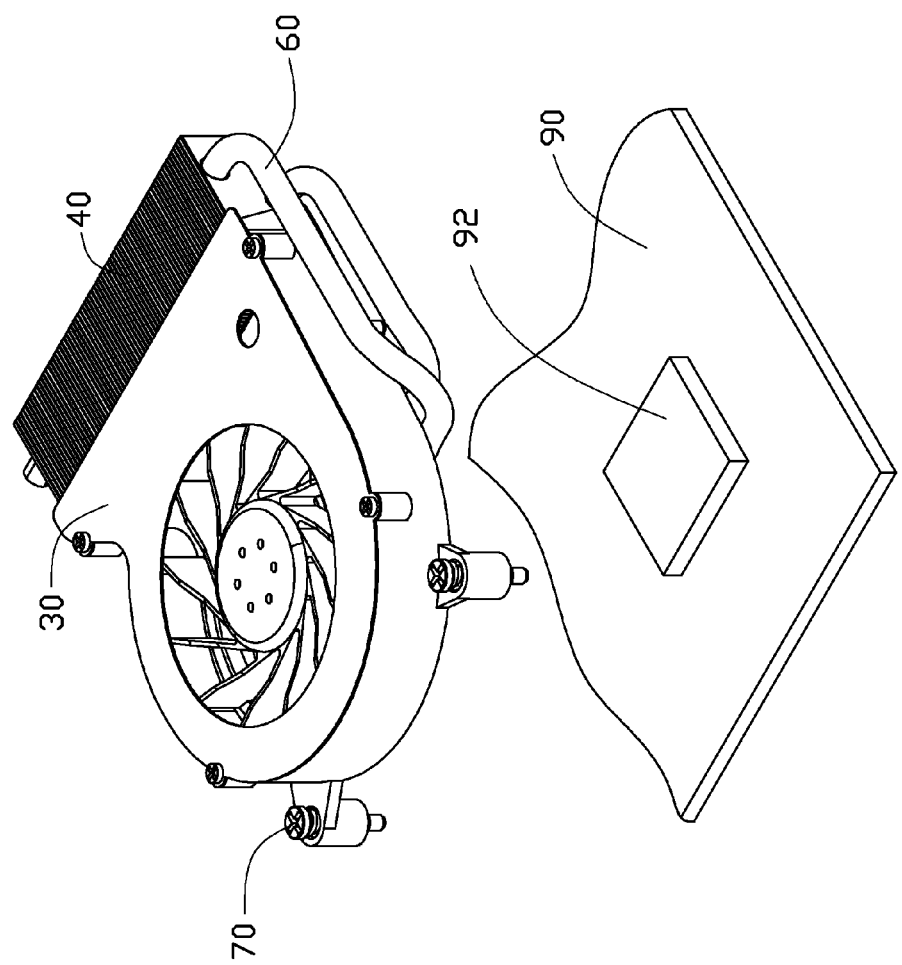
FIG. 1 is an isometric view of a heat dissipation device of the present disclosure, wherein a printed circuit board is placed below the heat dissipation device.
Figure 2:
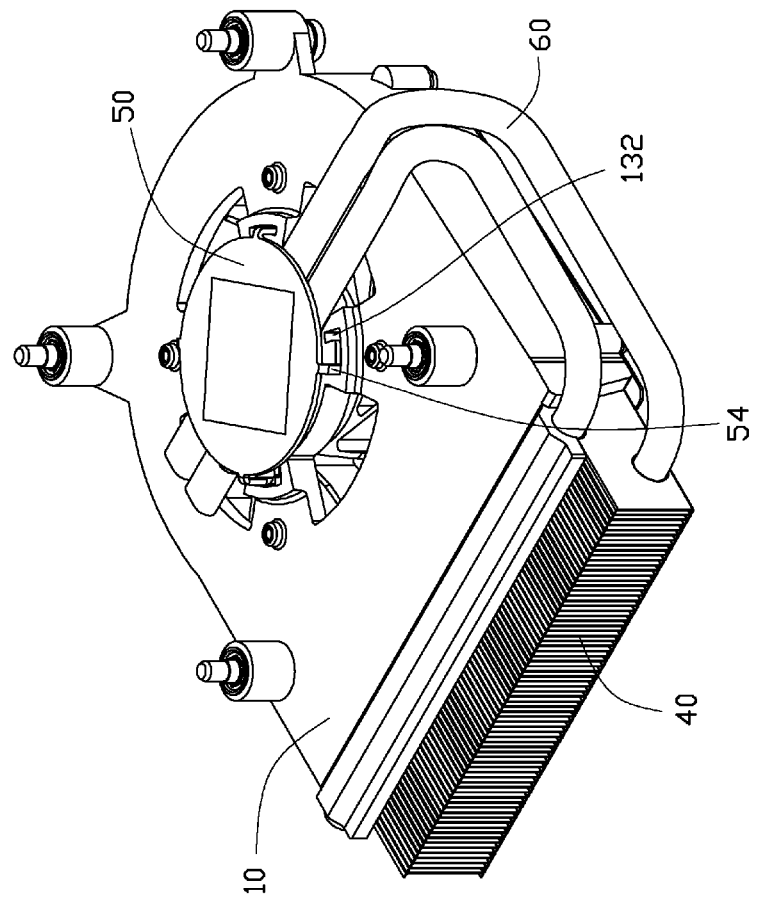
FIG. 2 is an inverted view of the heat dissipation device of FIG. 1, wherein a base of the heat dissipation device is in a locked position.
Figure 3:
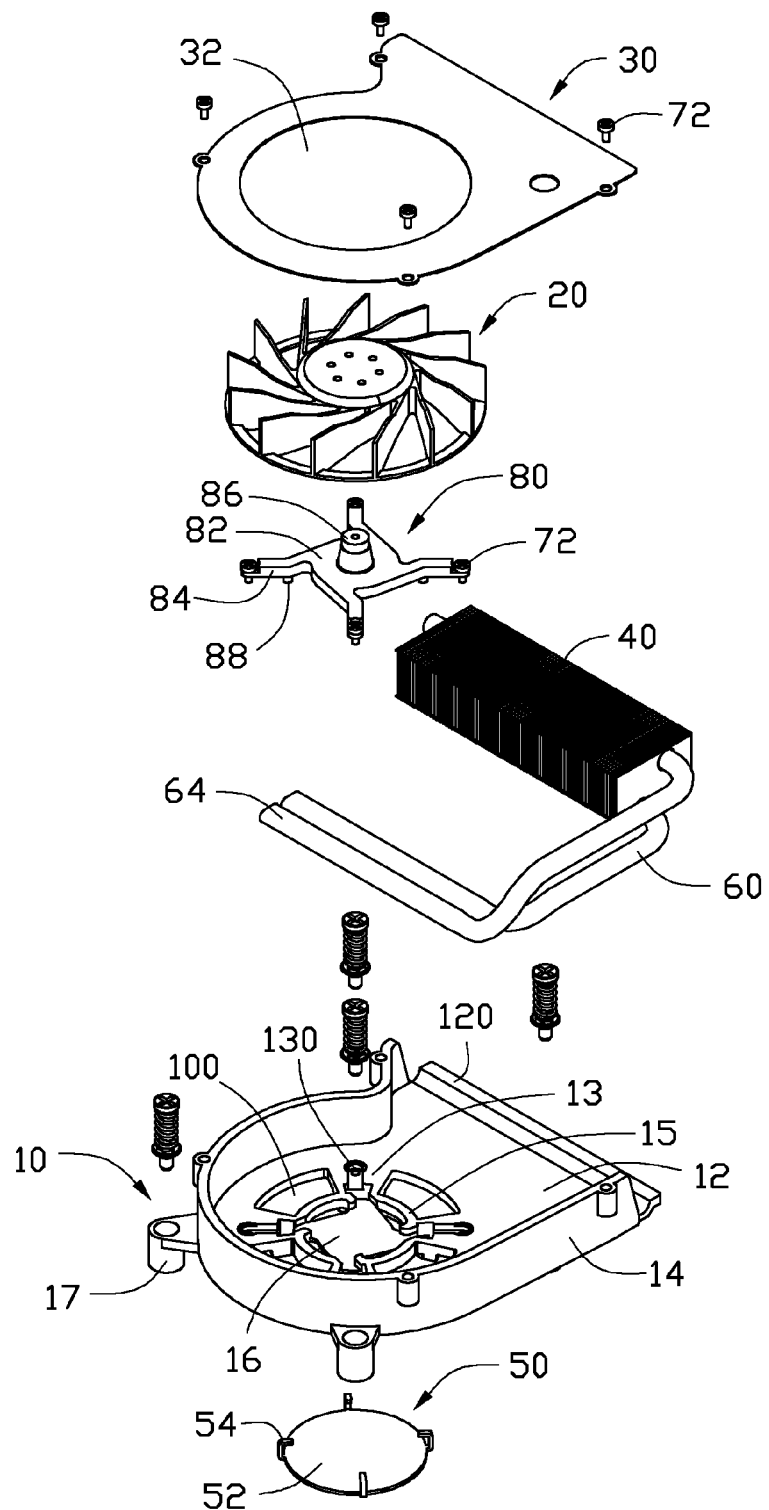
FIG. 3 is an exploded view of the heat dissipation device of FIG. 1.

Referring to FIGS. 1-3, a heat dissipation device of the present disclosure is illustrated. The heat dissipation device includes a shroud 10, a bracket 80 fixed on the shroud 10, an impeller 20 rotatably mounted on the bracket 80, a cover 30 secured on a top of the shroud 10 to cover the impeller 20, a base 50 attached on a bottom of the shroud 10, a fin assembly 40 comprising a plurality of fins arranged on the shroud 10, and two heat pipes 60 extending through the fin assembly 40 and sandwiched between the base 50 and the shroud 10. A printed circuit board 90 has an electronic component 92 mounted thereon, and is placed below the heat dissipation device.

Figure 4:
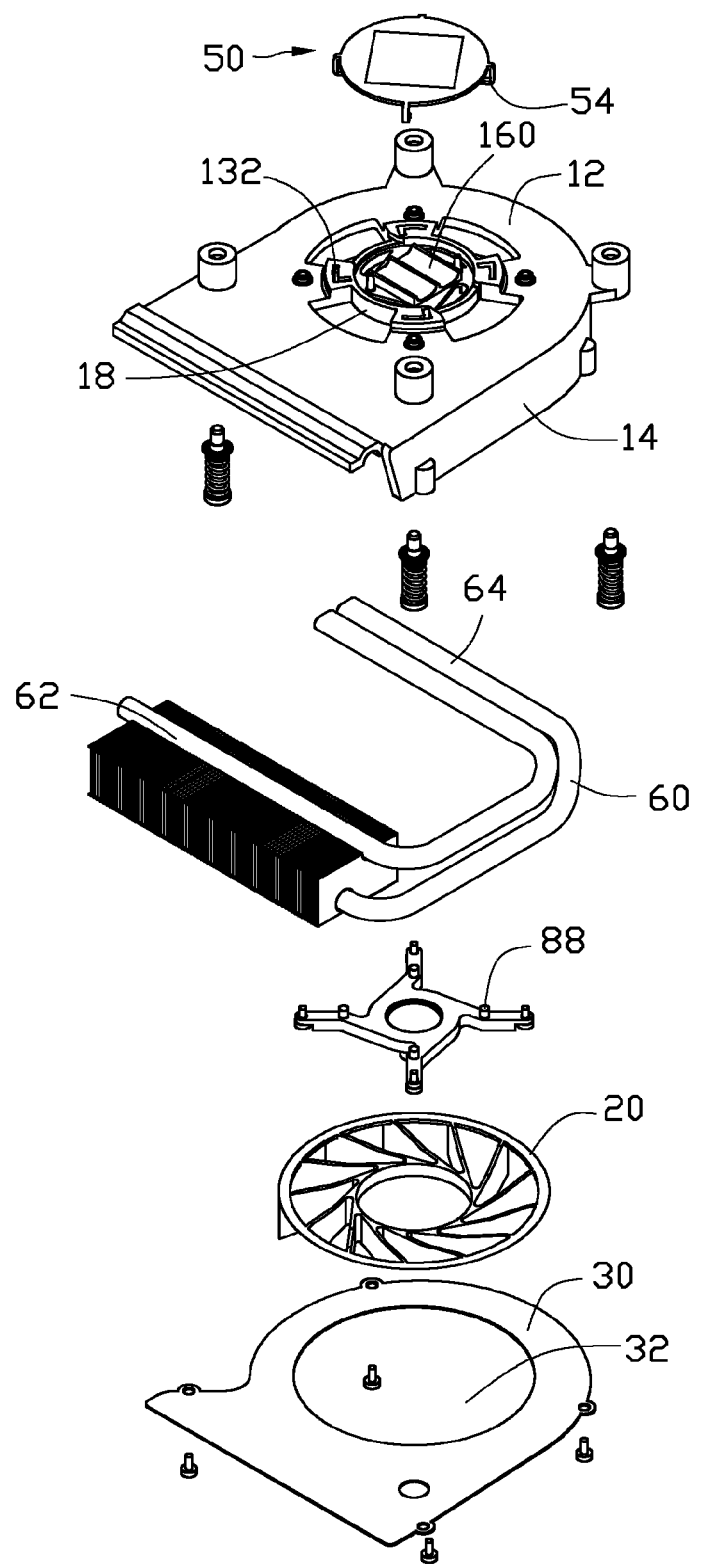
FIG. 4 is an inverted exploded view of the heat dissipation device of FIG. 3.

Also referring to FIG. 4, the shroud 10 is integrally made from metal such as copper or aluminum. The shroud 10 includes a bottom section 12 and a sidewall 14 extending upwardly from a periphery of the bottom section 12. The bottom section 12 includes a semicircular part and a rectangular part connected to the semicircular part. A circular opening 100 is defined in the bottom section 12 and is located adjacent to a boundary of the semicircular part and the rectangular part of the bottom section 12. A first circular plate 16 is formed within the circular opening 100 and is connected to an inner circumferential face of the bottom section 12 defining the opening 100 by four uniformly distributed beams 13. Four ridges 15 are formed on a top of the first circular plate 16 along a circumferential periphery thereof, wherein every two adjacent ridges 15 are spaced from each other to leave a gap therebetween. Each ridge 15 has one end coupled to a corresponding beam 13 and one opposite end curved inwardly. The circular plate 16 defines two grooves 160 on a bottom thereof for receiving the two heat pipes 60. A bottom of each beam 13 is stepped down such that an inner portion thereof is coplanar with a bottom of the circular plate 16, and an outer portion thereof is flush with a bottom of the bottom section 12 which is higher than the bottom of the circular plate 16. Each beam 13 has a notch 130 defined in a top thereof and a channel 132 defined in a bottom thereof and communicating with the notch 130. The notch 130 is extended from an end of the beam 13 and terminated at the gap between every two adjacent ridges 15. The channel 132 is L-shaped and includes a radial part and a circumferential part communicated with the radial part. The sidewall 14 partially surrounds the bottom section 12 in a manner that an end of the rectangular part of the bottom section 12 horizontally extends beyond the sidewall 14 to form a bridge 120 at one side of the shroud 10. The bridge 120 supports the fin assembly 40 thereon. Four legs 17 are downwardly formed on the bottom of the bottom section 12 for allowing a plurality of fasteners 70 to extend through the shroud 10 into the printed circuit board 90, thereby securing the heat dissipation device on the printed circuit board 90.

Figure 5:
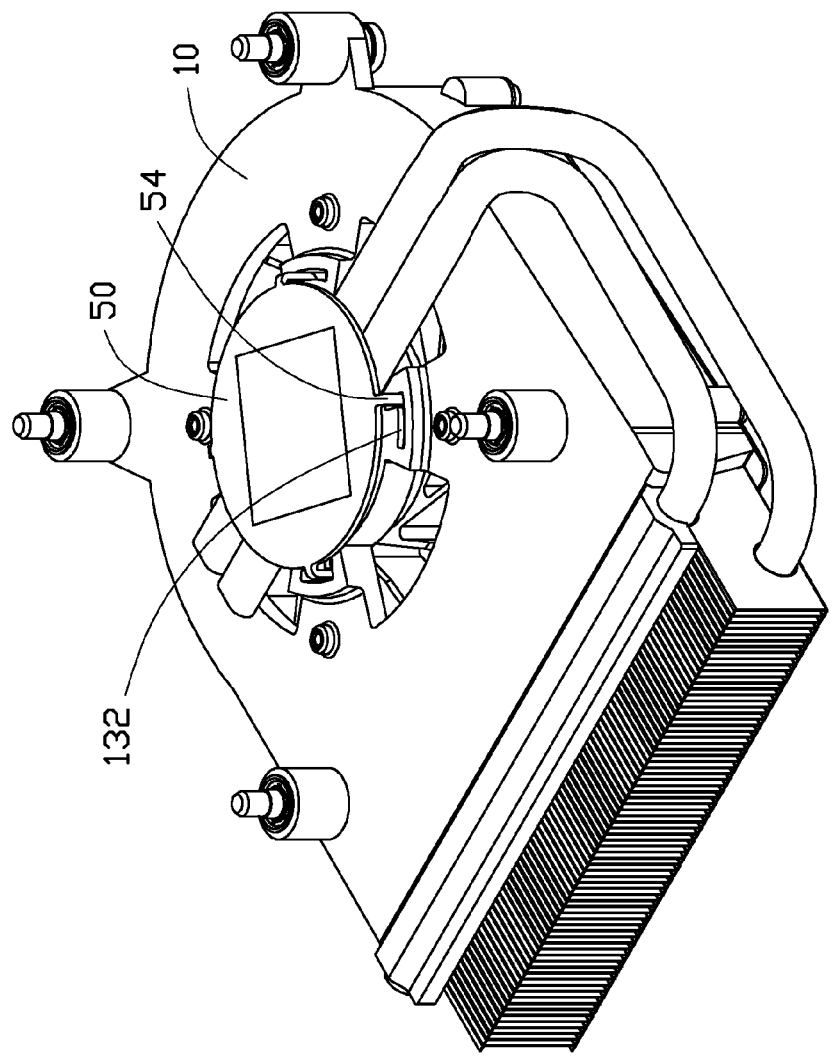
FIG. 5 is similar to FIG. 2, wherein the base of the heat dissipation device is in a released position.

Also referring to FIG. 5, the base 50 includes a second circular plate 52 and four latch hooks 54 extending upwardly from the plate 52. The plate 52 is used for contacting the electronic component 92 to absorb heat from the electronic component 92 to the bottom section 12. Each latch hook 54 has an L-shaped configuration. In assembly of the base 50 to the shroud 10, the latch hooks 54 are extended into the bottom section 12 through the radial parts of the channels 132 from a bottom of the circular plate 16 as shown in FIG. 5, and then rotated along the circumferential parts of the channels 132 until reaching to be abutting the terminal ends of the circumferential parts of the channels 132 as shown in FIG. 2. Thus, the base 50 is securely fixed on the shroud 10.

Each of the two heat pipes 60 is U-shaped. The two heat pipes 60 includes a plurality of evaporating ends 64 which are retained within the grooves 160 of the shroud 10 and sandwiched between the circular plate 16 and the base 50, and a plurality of condensing ends 62 which are inserted into the fin assembly 40 to transfer the heat from the base 50 to the fin assembly 40.

The bracket 80 is mounted on the circular plate 16 of the shroud 10 for supporting the impeller 20 thereon. The bracket 80 includes a square chassis 82, a post 86 protruding upwardly from a center of the chassis 82 and four arms 84 extending outwardly from four corners of the chassis 82, respectively. The chassis 82 is disposed on the circular plate 16 of the shroud 10 with the four arms 84 extending through the gaps between the ridges 15 and received in the four notches 130, respectively. Each arm 84 has a protrusion 88 protruding downwardly from a middle of a bottom thereof and into a corresponding channel 132 through the notch 130 of the shroud 10. The protrusion 88 is employed to abut against the latch hook 54 of the base 50, received in the channel 132, for preventing the base 50 from sliding along the circumferential part of the channel 132, thereby ensuring more reliable attachment of the base 50 to the shroud 10. Four screws 72 are further extended through a plurality of distal ends of the four arms 84 and into the notches 130, thereby securing the bracket 80 onto the circular plate 16 of the shroud 10.

The impeller 20 is rotatably mounted on the post 86 of the bracket 80 to produce an airflow for cooling the heat dissipation device. The impeller 20 sucks air from an outside environment of the heat dissipation device into the shroud 10 through the opening 100, and drives the airflow out of the shroud 10 through the fin assembly 40 by the guidance of the sidewall 14, thereby dissipating heat from the fin assembly 40 to the outside environment. Alternatively, it is understood that the direction of the airflow generated by the impeller 20 can be reversed depending on actual operating requirements, i.e., the airflow can be drawn into the shroud 10 from the fin assembly 40 and expelled out of the shroud 10 through the opening 100.

The cover 30 has a profile coincidental with that of the bottom section 12. The cover 30 defines a circular window 32 corresponding to the opening 100 of the shroud 10 for allowing the airflow to enter and exitout of the shroud 10. Four screws 72 extend through four corners of the cover 30 into a top of the sidewall 14 to secure the cover 30 onto the shroud 10.

Compared with conventional soldered base, the base 50 disclosed above can be conveniently assembled to the shroud 10 by clasping the latch hooks 54 thereof with the circular plate 16 of the shroud 10 without requiring the use of a clamp. Furthermore, the space in between the base 50 and the plate 16 can be filled with a thermal interface material to substitute conventional solder for facilitating improved heat conduction from the base 50 to the shroud 10.

It is believed that the present disclosure and its advantages will be understood from the foregoing description, and it will be apparent that various changes may be made thereto without departing from the spirit and scope of the present disclosure or sacrificing all of its material advantages, the examples hereinbefore described merely being preferred or exemplary embodiments.

What is claimed is:

1. A heat dissipation device for dissipating heat from an electronic component, the heat dissipation device comprising:
   a base for contacting the electronic component, the base comprising a circular plate and a plurality of latch hooks extending from the circular plate;
   a shroud; and
   a fin assembly extending on the shroud;
   wherein the latch hooks of the base are extended into the shroud to lock with the shroud.

2. The heat dissipation device as claimed in claim 1, wherein the latch hooks of the base are slidable with respect to the shroud.

3. The heat dissipation device as claimed in claim 2, wherein the shroud defines a plurality of channels receiving the latch hooks, respectively.

4. The heat dissipation device as claimed in claim 3, wherein each of the latch hooks is L-shaped.

5. The heat dissipation device as claimed in claim 4, wherein each of the channels has a radial part and a circumferential part communicating with the radial part, the latch hooks being extended into the shroud through the radial parts of the channels and slidable along the circumferential parts of the channels.

6. The heat dissipation device as claimed in claim 3, further comprising a bracket mounted on the shroud, wherein the bracket comprises a protrusion received in a corresponding channel to abut against a corresponding latch hook, thereby preventing the latch hooks from sliding.

7. The heat dissipation device as claimed in claim 6, wherein the base and the bracket are located at two opposite sides of the shroud.

8. The heat dissipation device as claimed in claim 6, wherein the bracket comprises a chassis, a plurality of arms extending outwardly from the chassis and a post extending upwardly from the chassis, the protrusion extending downwardly from one arm.

9. The heat dissipation device as claimed in claim 8, further comprising an impeller rotatably mounted on the post of the bracket.

10. The heat dissipation device as claimed in claim 8, wherein the shroud comprises a bottom section defining an opening, another circular plate formed within the opening and a plurality of beams interconnecting the another circular plate to the bottom section.

11. The heat dissipation device as claimed in claim 10, wherein each of the beams defines a notch in a top thereof to receive a corresponding arm of the bracket therein, the channels being defined in the bottoms of the beams and communicating with the notches, respectively.

12. The heat dissipation device as claimed in claim 11, wherein the shroud comprises a plurality of ridges extending along a periphery of the another circular plate, and each of the ridges has an end connected to a corresponding beam and an opposite end curved inwardly to be spaced from an adjacent ridge, each of the arms of the bracket being received between two corresponding ridges.

13. The heat dissipation device as claimed in claim 10 further comprising a heat pipe, wherein the heat pipe has an end extending through the fin assembly and an opposite end sandwiched between the circular plate and the base.

14. The heat dissipation device as claimed in claim 10, wherein a thermal interface material is filled between the another circular plate and the base.

15. The heat dissipation device as claimed in claim 10, wherein the shroud comprises a sidewall partially surrounding a periphery of the bottom section, an end of the bottom section extending outside beyond the sidewall to form a bridge supporting the mounting of the fin assembly.

16. The heat dissipation device as claimed in claim 15 further comprising a cover mounted on the sidewall of the shroud, wherein the cover defines a window corresponding to the opening of the shroud.

17. The heat dissipation device as claimed in claim 1, wherein the shroud is integrally made from metal.

* * * * *